United States Patent [19]

Ruberto et al.

[11] Patent Number: 5,081,002

[45] Date of Patent: Jan. 14, 1992

[54] METHOD OF LOCALIZED PHOTOHEMICAL ETCHING OF MULTILAYERED SEMICONDUCTOR BODY

[75] Inventors: Mark N. Ruberto; Alan E. Willner, both of New York; Richard M. Osgood, Jr., Chappaqua; Dragan V. Podlesnik, New York, all of N.Y.

[73] Assignee: The Trustees of Columbia University in the City of New York, New York, N.Y.

[21] Appl. No.: 342,528

[22] Filed: Apr. 24, 1989

[51] Int. Cl.$^5$ .................. G03C 5/00; H01L 21/312; H01L 21/306

[52] U.S. Cl. .................. 430/297; 156/635; 156/652; 156/655; 156/656; 156/662

[58] Field of Search .............. 430/292, 297; 156/635, 156/652, 655, 656, 662

[56] References Cited

U.S. PATENT DOCUMENTS

| | | | |
|---|---|---|---|
| 3,341,937 | 9/1967 | Dill, Jr. ................ | 29/583 |
| 3,457,633 | 7/1969 | Marinace et al. ......... | 29/583 |
| 4,061,530 | 12/1977 | Hosack ................. | 156/653 |
| 4,063,992 | 12/1977 | Hosack ................. | 156/653 |
| 4,075,652 | 2/1978 | Umebachi et al. ........ | 357/22 |
| 4,236,296 | 12/1980 | Woolhouse et al. ....... | 29/569 L |
| 4,276,098 | 6/1981 | Nelson et al. ........... | 148/171 |
| 4,354,898 | 10/1982 | Coldren et al. .......... | 156/647 |
| 4,354,898 | 10/1982 | Coldren et al. .......... | 156/647 |
| 4,518,456 | 5/1985 | Bjorkholm .............. | 156/626 |
| 4,597,003 | 6/1986 | Aine et al. ............. | 357/26 |
| 4,692,207 | 9/1987 | Bouadma et al. ......... | 156/649 |
| 4,707,219 | 11/1987 | Chen ................... | 156/644 |
| 4,758,532 | 7/1988 | Yagi et al. ............. | 437/129 |
| 4,769,342 | 9/1988 | Yagi et al. ............. | 437/129 |
| 4,783,237 | 11/1988 | Aine et al. ............. | 437/15 |
| 4,784,722 | 11/1988 | Liau et al. ............. | 156/649 |

FOREIGN PATENT DOCUMENTS 0037876 10/1981 European Pat. Off. .
WO/8300073 1/1983 PCT Int'l Appl. .

OTHER PUBLICATIONS

Podlesnik et al., "Deep-ultraviolet induced wet etching of GaAs", Appl. Phys. Lett. 45(5), Sep. 1984, pp. 563–565.
Tijburg et al., "Selective Etching of III-V Compounds with Redox Systems", J. Electrochem. Soc; Solid-State Science & Technology, May 1976, pp. 687–691.
Osgood et al., "Localized laser etching . . . ", Appl. Phys. Lett. 40(5), Mar. 1982, pp. 391–393.
Logan et al., "Optical Waveguides . . . " J. Appl. Phys., vol. 44(9), Sep. 1973, pp. 4172–4176.

Primary Examiner—Charles L. Bowers, Jr.
Assistant Examiner—Ashley I. Pezzner
Attorney, Agent, or Firm—Brumbaugh, Graves, Donohue & Raymond

[57] ABSTRACT

The sensitivity of localized photochemical etching to the optical and electrical properties of multilayered semiconductor materials is utilized for selectively etching a laterally extending undercut in a buried layer. The semiconductor body is immersed in a suitable etching solution and a beam of light of appropriate wavelength and intensity is directed onto the semiconductor solution interface. The buried layer has a longer diffusion length for photogenerated carriers than the layers adjacent thereto, casuing carriers to diffuse away from the illuminated region within the buried layer and thereby etch the buried layer laterally, undercutting the adjacent layers.

12 Claims, 7 Drawing Sheets

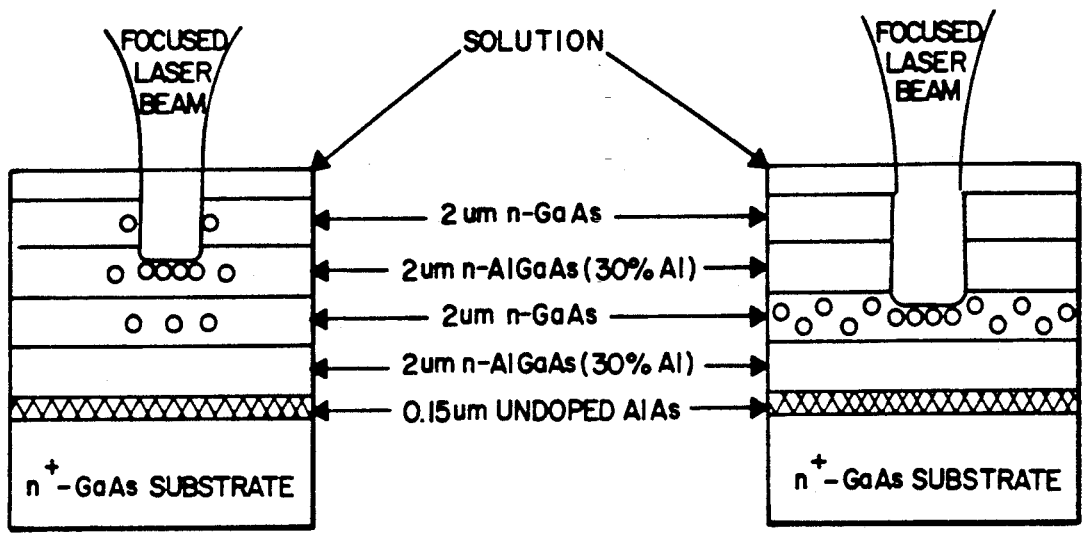
FIG. 7A
FIG. 7B
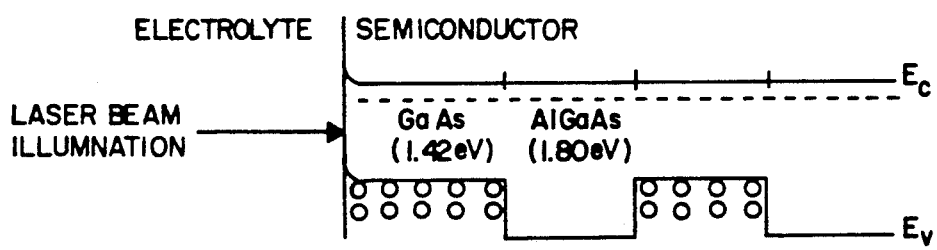
FIG. 8
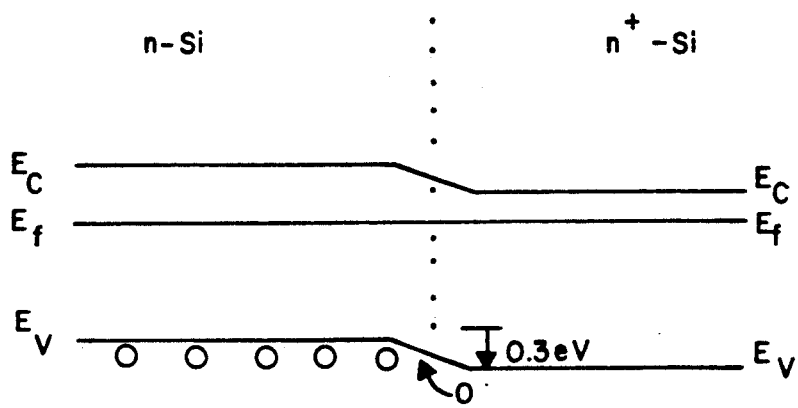
FIG. 9

METHOD OF LOCALIZED PHOTOHEMICAL ETCHING OF MULTILAYERED SEMICONDUCTOR BODY

This invention was made with Government support under F49620-82-C00067 awarded by the Air Force. The Government has certain rights in this invention.

BACKGROUND OF THE INVENTION

This invention relates generally to light-controlled etching of semiconductor material and, more particularly, to an etching method utilizing a laser for controlled etching of a laterally extending undercut in a multilayered semiconductor body.

The varying properties of III–V layered materials have made possible many techniques for the fabrication of novel microstructures. Heretofore, fabrication of such devices have generally involved a multi-step process which sometimes adversely affects the entire surface of the semiconductor body. The laser-controlled aqueous etching of semiconductors is very attractive for this purpose since this process is sensitive to both the electrical and optical properties of the material. It is known from the enclosed papers listed in Table 1, the disclosures of which are hereby incorporated herein by reference, to utilize laser-assisted selective etching of GaAs/AlGaAs systems in the fabrication of various devices. Briefly, Brown et al. use light that is absorbed only in GaAs and not in AlGaAs so as to photo-chemically etch only GaAs on a GaAs/AlGaAs/GaAs substrate sample. An etch stop is generated at the AlGaAs layer with the consequence that these investigators did not observe an undercut. The papers by Deckman et al., Logan et al. and Tijburg et al. disclose the formation of undercuts in multilayered semiconductor structures using dark selective etching, and Kern et al. present an overview of dark chemical etching of bulk materials and on pages 438–462 lists various dark semiconductor etchants. The Podlesnik and Gilgen paper describes the photochemical etching mechanism and discloses devices that have been fabricated utilizing the process. The table on page 116 lists the etchants that were used in the light-controlled etching of the listed semiconductors. The papers not specifically mentioned above disclose other light-generated etching processes including laser-assisted dry etching in a gas ambient and laser-enhanced plasma etching.

In the photochemical etching of bulk semiconductor bodies, the dissolution process is controlled by the flow of carriers across the semiconductor/solution interface. In particular, photogenerated holes initiate an anodic reaction that results in the formation of an oxide which is then soluble in the solution. The transport of these holes to the surface and their resultant spatial distribution therefore determines the morphology of the etched structures. Although the prior art discusses the theory and utility of laser-assisted techniques for controlling liquid-phase etching of bulk semiconductor bodies, there is no apparent recognition that the etching mechanism for bulk material would be operable in layered structures to etch a laterally extending undercut in a buried layer, for example. Applicants have recognized that the band bending at the interface between two layers having different conductivity types, one of which is buried, controls the flow of photogenerated carriers within the structure, resulting in the confinement of these carriers to a desired layer within the sample which changes the morphology of the etched feature relative to what is seen in bulk materials.

Table 1

1. "Laser-Assisted Selective Chemical Etching of GaAs/AlGaAs Layered Structures", R. T. Brown, et al, Materials Research Symposium Proc., Vol. 75, 1967 Materials Research Society, pp. 411–416
2. "Optical Waveguides in GaAs.AlGaAs Epitaxial Layers", R. A. Logan, et al., J. Appl. Phys., Vol. 44, No. 9, September 1973, pp. 4172–4176
3. "Selective Etching of III-V Compounds With Redox Systems" R. P. Tyburg et al., J. Electrochem. Soc., SOLID STATE SCIENCE AND TECHNOLOGY, May 1976, pp. 687-691
4. "Microporous GaAs/GaAlAs Super Lattices" H. W. Dickman, et al., J. Vac. Sci. Technol. B6(1), Jan/Feb 1988, pp. 316–318
5. "Chemical Etching" and "Plasma-Assisted Etching Technique for Pattern Delineation", taken from "Thin Film Processes", edited by J. Vossen and W. Kern, Academic Press, 1978
6. "Laser-controlled etching of semiconductors in Solutions", Dragan V. Podlesnik and Heinz H. Gilgen
7. "An Overview of Laser Chemical Processing", R. M. Osgood, Jr., Mat. Res. Soc. Symp. Proc. Vol. 74, 1987, pp. 75–86
8. "Excimer-Laser-Initiated Dry Etching of Single Crystal GaAs" P. Brewer, et al. Mat. Res. Soc. Proc. Vol. 29, 1984, pp. 179-184
9. "Direct Holographic Processing Using Laser Chemistry", H. H. Gilgen et al., Mat. Res. Symp. Proc. Vol. 29, 1984, pp. 139–144
10. "Localized Laser Etching of Compound Semiconductors in Aqueous Solution", R. M. Osgood, Jr., et al., Appl. Phys. Lett. 40(5), 1 March 1982, pp. 391–393
11. "Photochemical Processing of Semiconductors: New Applications for Visible and Ultraviolet Lasers" J. G. Eden, IEEE Circuits and Devices Magazine, Jan. 1986, pp. 18–24
12. "Laser Generated Microstructures" Y. Rytz - Froidevaux et al., Appl. Phys. A37, 1985, pp. 121–138
13. "Summary Abstract: Low-Temperature Deposition and Removal of Material Using Laser-induced Chemistry", R. M. Osgood, Jr. et al., J. Vac. Sci. Technol. A2 (2), Apr-Jun 1984, pp. 504–505
14. "Photon Assisted Dry Etching of GaAs", Peter Brewer, et al., Appl. Phys. Lett. 45(4) 15 Aug. 1984, pp. 475–477
15. "Laser-assisted Dry Etching of Semiconducting Materials", P. Brewer et al., SPIE Vol. 459 Laser Assisted Deposition, Etching and Doping (1984), pp. 128-131
16. "Laser-Assisted Dry Etching", P. D. Brewer, et al., Solid State Technology, April 1985, pp. 273–278
17. "Wavelength Dependence of Laser Enhanced Plasma Etching of Semiconductors", G. M. Reksten, et al., Appln. Phys. Lett. 48 (8), 24 February 1986, pp. 551–553
18. "Integrated Fiber-optic Coupler for Very Large Scale Integration Interconnects", P. R. Prucnal, et al., Optics Letters, Vol. 11, February 1986, pp. 109–111
19. "Interaction of deep-ultra violet laser light with GaAs surfaces in aqueous solutions", D. V. Podlesnik, et al., Jour. of Opt. Soc. of America B, Vol. 3, May 1986, pp. 775-784

20. "Waveguiding Effects in Laser-induced Aqueous Etching of Semiconductors", D. V. Podlesnik, et al., Appl. Phys. Lett. 48(7) 17 Feb. 1986, pp. 496–498
21. "Excimer Laser Projection Etching of GaAs", P. D. Brewer, et al., Appl. Phys. Lett. 49(13), 29 Sept 1986, pp. 803–805
22. "Rapid Direct Writing of High-Aspect-Ratio Trenches in Silicon", G. V. Treyz, et al., Appl. Phys. Lett. 50(8) 23 Feb. 1987, pp. 475–477
23. "Surface potential characterization of the photoelectrochemical etching system by photoreflectance and electroreflectance techniques", A. E. Willner, et al., SPIE Vol. 946 Spectroscopic characterization Techniques for Semiconductor Technology III, 1988, pp. 48–56
24. "Laser-Induced Chemistry for Microelectronics", R. M. Osgood, et al., Science, Vol. 227, No. 4688, 15 Feb. 1985, pp. 709–714
25. "Laser etching of LiNbO3 in a $Cl_2$ atmosphere", K. W. Beeson et al., J. Appl. Phys. 64(2), 15 July 1988, pp. 835–840
26. "Laser-assisted CVD Process for VLSI Microfabrication", R. M. Osgood, et al., Extended Abstracts of The 16th (1984 Intl) Conference on Solid State Devices and Materials, Kobe, 1984, pp. 427–428
27. "Ultrafast Aqueous Etching of Gallium Arsenide", A. E. Willner, et al
28. "Fabrication Techniques for Integrated Sensor Microstructures", H. Guckel et al., IEDM 1986, pp. 176–179

SUMMARY OF THE INVENTION

Briefly, the present invention is directed to a method which utilizes the sensitivity of localized photochemical etching to the optical and electrical properties of a multilayered semiconductor body having first and second layers of a first conductivity type and an intermediate layer having a second conductivity type for etching a laterally extending undercut in the intermediate layer. The method comprises the steps of immersing the semiconductor body in an etching solution which etches the semiconductor at a relatively low rate in the absence of light and at a relatively high rate in the presence of light, and exposing a selected area of the major surface of the top layer to a beam of light of appropriate wavelength and intensity. For a given semiconductor/etchant system, the wavelength is chosen such that photogenerated carriers can easily access the redox levels as shown in FIG. 13. Initially, a vertical opening having an area approximating the area of the light beam is etched through the first layer. Then, the intermediate layer is etched laterally from the area defined by the light beam to produce a lateral undercut in the intermediate layer. The interfacial electric field between the first and second layers and the intermediate layer controls the flow of photogenerated carriers within the structure, resulting in the confinement of these carriers to the intermediate layer. The intermediate layer has a diffusion length for the photogenerated carriers longer than that of the first and second layers; thus, carriers can then diffuse away from the illuminated region within the intermediate layer which, in turn causes the intermediate layer to be etched laterally, undercutting the first and second layers.

The method is particularly useful for making electrooptic devices of the kind used in optical communication networks and for this purpose may comprise the steps of immersing a semiconductor body consisting of n-GaAs/n-AlGaAs multilayers in an etchant which etches the material at an insignificant rate in the absence of light and at a relatively high rate in the presence of light, and exposing a selected area of the major surface of the upper layer, preferably GaAs, to a beam of light, from an $Ar^+$ laser operating at 514 nm, for example, focused to a spot size of 3–4 μm and having an intensity of about 50 watts/$cm^2$. By rastering the sample below a fixed laser spot, features may be masklessly engraved onto the major surface of the upper layer and as etching proceeds a trench is formed. Because of the band gap discontinuity at the interface between internal AlGaAs and GaAs layers, photogenerated carriers within the structure are confined to the GaAs layer, resulting in the controlled etching of a laterally extending undercut in the buried GaAs layer.

Therefore, it is the primary object of the present invention to provide a method for etching semiconductor materials which enables the fabrication of devices having intricate features with improved working efficiency in manufacturing by reducing the number of fabrication steps.

Other objects, features and advantages of the invention, and a better understanding of its operation, will be apparent from the following detailed description, read in conjunction with the accompanying drawings.

BRIEF DESCRIPTION OF THE DRAWINGS

FIGS. 7A and 7B are diagrams which illustrate the principle of hole confinement to buried layers within a layered structure.

FIG. 8 is a band diagram for the n-GaAs/n-AlGaAs heterostructure which illustrates the confinement of photogenerated holes in the n-GaAs layers. FIG. 9 is a band diagram for the n-Si on $n^+$-Si two-layered structure showing carrier confinement to the low-doped epilayer.

DESCRIPTION OF THE PREFERRED EMBODIMENTS

Figure 1A:
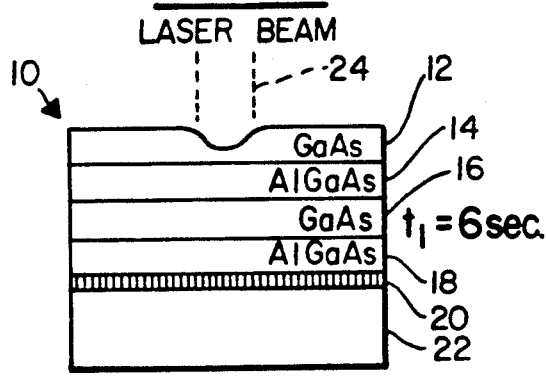
FIGS. 1A to 1H are schematic cross-sectional views illustrating evolutionary steps of the method for etching a laterally extending undercut in a multilayered semiconductor body.

The method for etching a laterally extending undercut in a buried layered of a multilayered semiconductor body according to the invention will be described with reference to FIGS. 1A to 1H which illustrate the temporal evolution of an etched trench at various times following the start of etching and the effect of the layer interfaces on the etching process. The illustrated multilayered semiconductor body 10 is a MOCVD-grown heterostructure consisting of the following layers: a top layer 12 of n-type GaAs 2 μm thick ($n=10^{16}/cm^3$), a layer 14 of n-type AlGaAs 2 μm thick ($n=10^{16}/cm^3$), a 2 μm thick layer 16 of n-type GaAs ($n=10^{16}/cm^3$), a 2 μm thick layer 18 of n-type AlGaAs ($n=10^{16}/cm^3$3) and a 0.15 μm thick layer 20 of undoped-AlAs on an $n^+$- GaAs substrate 22.

In carrying out the method, the body 10 is mounted within a quartz cell and immersed in an etchant solution that does not produce significant etching in the absence of light; a suitable etchant for this heterostructure is a solution of 5% $HNO_3$, since this reagent is effective to etch both gallium arsenide and aluminum gallium arsenide in the presence of light. A laser beam 24 from an $Ar^+$ laser (not shown) operating at 514 μm is focused to a spot size of 3 to 4 μm onto the upper surface of the upper layer 12. The intensity of the laser beam is preferably on the order of 50 watts/cm², well below the level of significant thermal excitation of both the semiconductor and the etchant solution. By rastering the semiconductor body 10 below a fixed laser spot, desired features, such as the U-shaped structure shown in FIGS. 5 and 6 can be engraved, without a mask, onto the upper surface and, as will be seen, into other layers of the body.

Figure 1E:
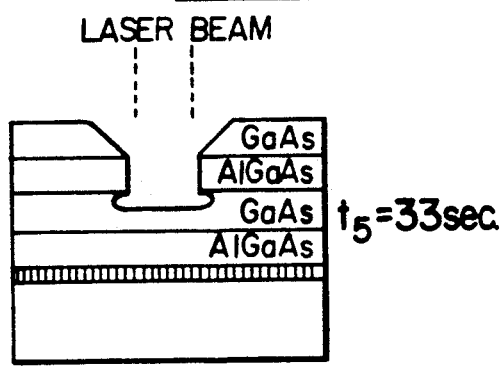
Figure 1B:
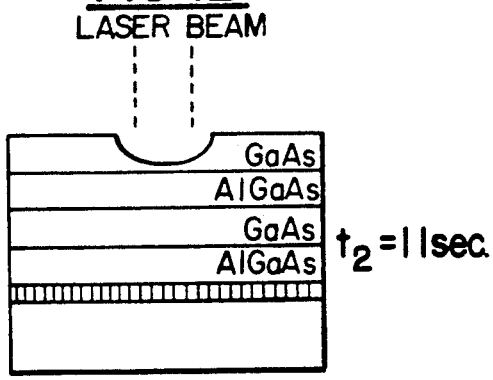
Figure 1F:
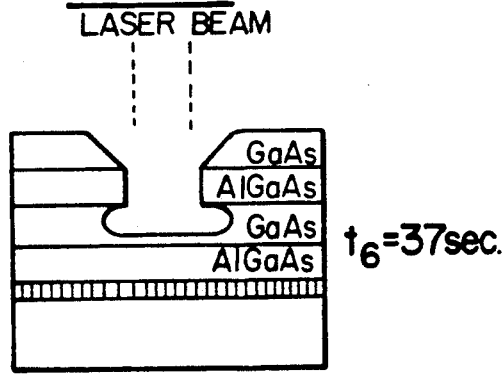
Figure 1C:
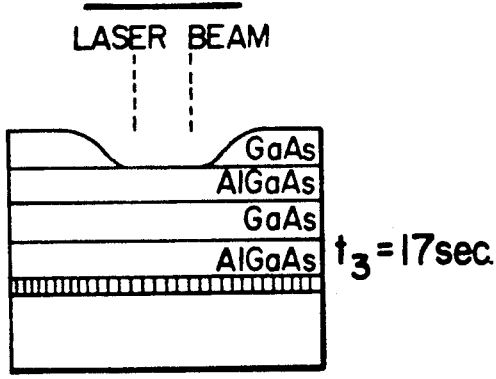
Figure 1G:
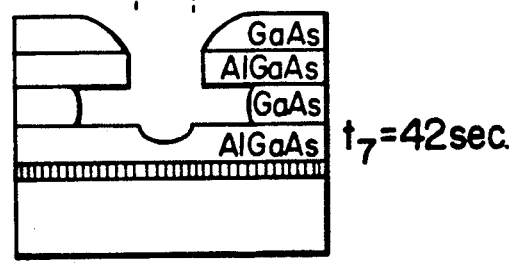
Figure 1D:
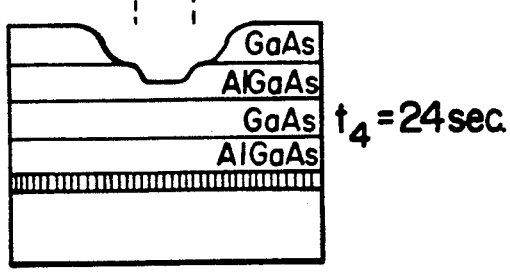
Figure 1H:
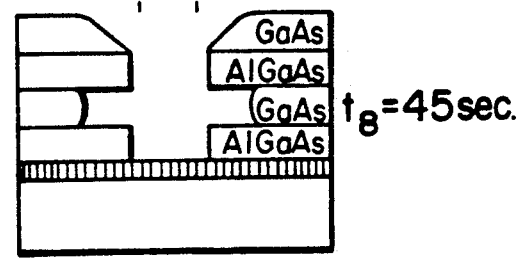
Figure 2:
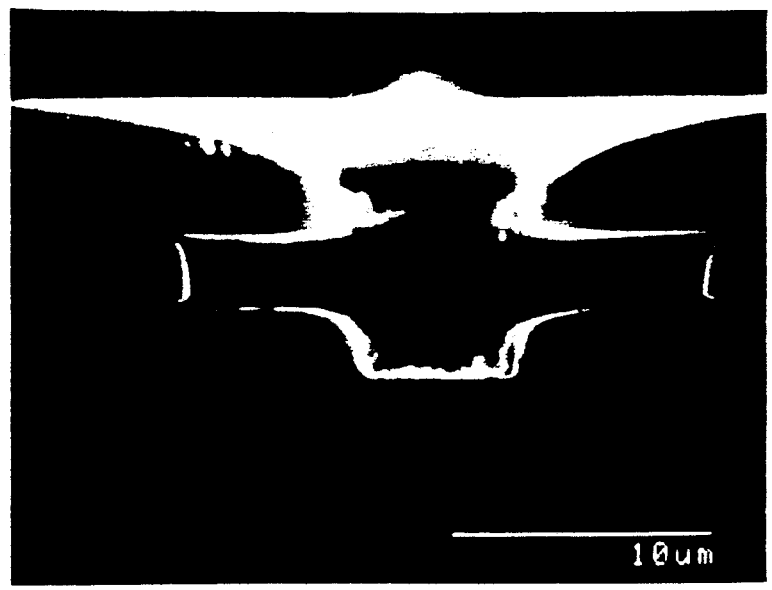
FIG. 2 is a photomicrograph showing the cross-section of a laser-etched line through a GaAs/AlGaAs heterostructure.

The effect of the layer interfaces on the etching process is evident from the illustrated temporal evolution of the etched trench, which was obtained by varying the scan velocity of the laser beam. As the beam starts etching the top n-GaAs layer 12 at a rate of 10 μm/min., a profile similar in shape to that of the Gaussian beam profile is engraved in its upper surface, and as etching proceeds therethrough the trench profile extends laterally somewhat from the laser spot, as shown in FIGS. 1B and 1C. When the upper surface of the AlGaAs layer 14 is reached, after 17 seconds, the vertical etching rate increases to about 18 μm/min. and the trench profile, as shown in FIG. 1D, is more nearly confined to the area of the laser beam. However, when the third layer 16 (GaAs) is reached (FIG. 1E) both vertical and lateral etching occurs at etch rates of 17 and 26 μm/min., respectively, resulting in undercutting of the buried GaAs layer to a lateral width of 10 μm from the center of the trench; three stages of the evolution of the undercut are illustrated in FIGS. 1E to 1G. As etching proceeds to the fourth layer 18, the start of which is shown in FIG. 1G, the width of the trench is again substantially the same size as in the second layer 14, both of which are AlGaAs. The etching is stopped at the AlAs layer 20. The selective undercutting of the GaAs layer forms a pair of cantilever structures at opposite sides of the trench, as seen in FIG. 2.

Lateral etching of the GaAs layer 16 is a carrier diffusion phenomenon which results from a spread in the photogenerated hole distribution at the semiconductor/solution interface due to longer diffusion lengths in the adjacent layers. To account for the undercutting in the sandwiched n-GaAs material, photogenerated holes are confined to this layer by the valence band discontinuity of 0.4 eV between the GaAs and AlGaAs layers, which constrains the entire population of holes at the semiconductor/solution interface to the small GaAs contour exposed to the electrolyte. Therefore, undercutting occurs only within the sandwiched n-GaAs layer, the lateral width of which is controlled by the hole diffusion length, and thus by the layer doping. There is no possibility that the lateral etching results from light reflected off the bottom of the trench and onto the sidewalls since the lateral etch rate is faster than the vertical etch rate.

The effect of diffusion length and carrier confinement on the morphology of a laser-etched trench has been illustrated by etching the following simpler structures:

(1) 12 μm epilayer of n-Si ($n=10^{16}/cm^3$) on an $n^+$-Si substrate ($n=10^{19}/cm^3$ (2) 6 μm epilayer of n- GaAs ($n=10^{16}/cm^3$) on an $n^+$- GaAs substrate ($n>10^{18}/cm^3$)

Figure 10:
FIG. 10 is a photomicrograph showing the top view of a line etched on a $n/n^+$-Si body.
Figure 11:
FIG. 11 is a photomicrograph showing the cross-section of a line etched on a $n/n^+$GaAs body.

The GaAs sample was etched in an aqueous 5% $HNO_3$ solution using 514 nm light, and the silicon sample was etched in $HF:HNO_3: H_2O::8:1:100$ using 257 nm light. The interfacial electric field between the epilayer and substrate, for both samples, tends to push holes back into the epilayer; thus, photogenerated holes in the epilayer remain confined to that layer. The band diagram for the silicon sample is shown in FIG. 9; the band diagram for the GaAs sample is similar. In both cases, the trench width of a line etched into the sample was considerably wider in the epilayer, which has a much longer diffusion length. The FIG. 10 photomicrograph shows a top view of a line etched on the $n/n^+$-Si sample; the narrow inner trench is in the substrate, which has a much lower diffusion length than the epilayer. The cross-section of a line laser-etched in the $n/n^+$-GaAs sample shown in FIG. 11 reveals the same trend.

For the case of a semiconductor slab covered on the top with etchant solution and whose bottom surface provides hole confinement as in the above cases, the effect of diffusion length, $L_p$ and the vertical confinement of photogenerated holes from a Gaussian laser beam on the carrier distribution at the surface of a semiconductor slab having a thickness $d<L_p$, is illustrated by the diffusion equation which is given in cylindrical coordinates by:

$$D_p\left[\frac{1}{\rho}\frac{\partial}{\partial\rho}\rho\frac{\partial\Delta p}{\partial\rho}-\frac{\partial^2\Delta p}{\partial z^2}\right]-\frac{\Delta p}{\tau_p}+\frac{\alpha\phi}{\pi\rho_o^2}e^{-\alpha z_e-\rho^2/\rho_0^2}=0 \quad (1)$$

where $\Delta p(\rho,z)$ is the angularly independent excess hole density. $D_p$ and $\tau_p$ are the hole diffusivity and lifetime. $\alpha$, $\rho$, and $\phi$ are the absorption constant, beam radius, and absorbed photon flux, respectively. The boundary condition of surface recombination was used to account for the removal of holes into the solution during the etching process from the top of the slab. The constraint of no diffusion current through the bottom of the layer provided hole confinement to the slab of thickness d, i.e.

$$\left.\frac{\partial \Delta p}{\partial z}\right|_{z=0} = \frac{S\Delta p(0)}{D_p}, \left.\frac{\partial \Delta p}{\partial z}\right|_{z=d} = 0 \quad (2)$$

where S is the surface recombination velocity. Equations (1) and (2) were numerically solved for $\Delta p(\rho, z=0)$, the photogenerated hole distribution at the slab surface, using a Hankel transform.

Figure 3:
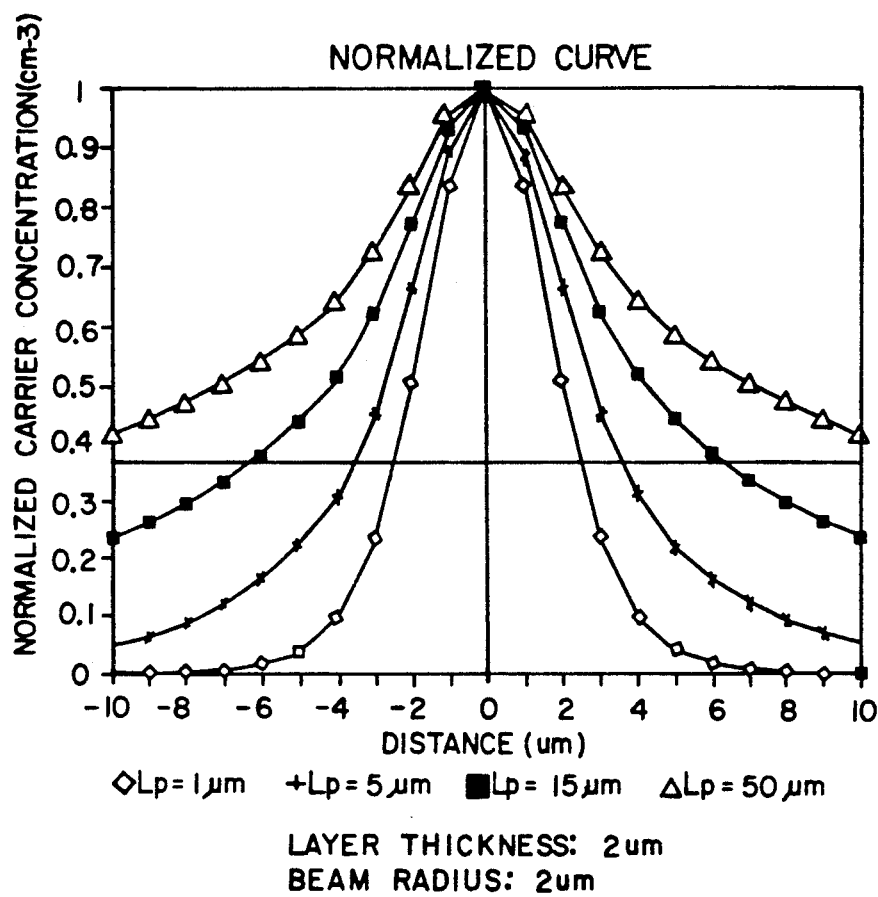
FIG. 3 is a family of curves illustrating the dependence of the surface distribution of photogenerated holes on diffusion length.
Figure 4:
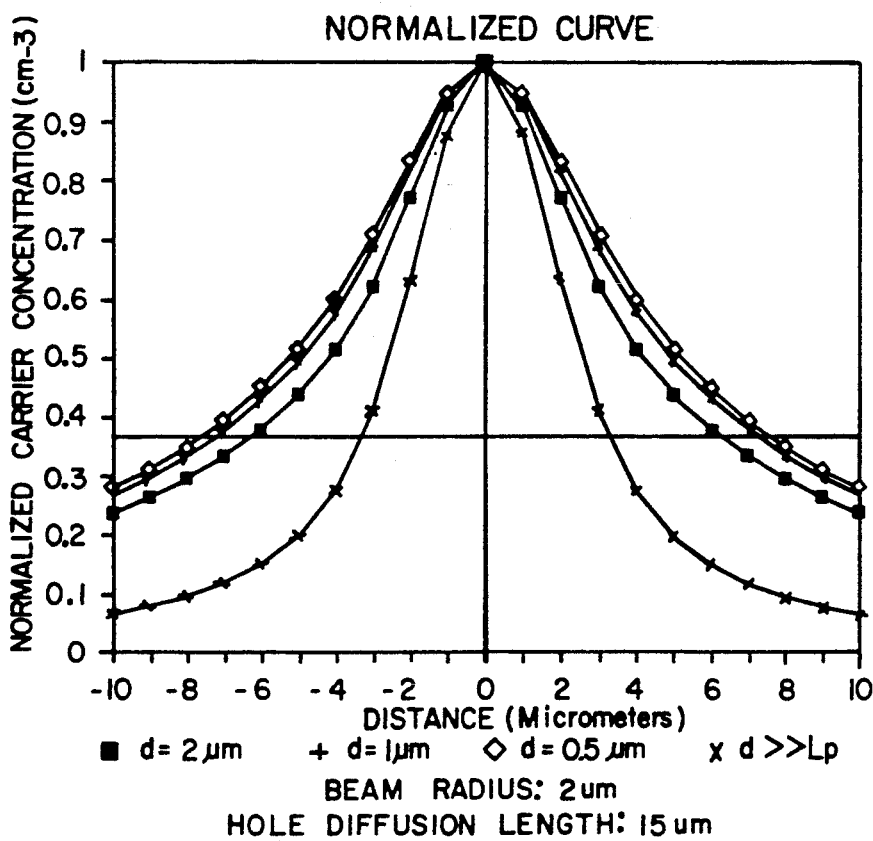
FIG. 4 is a family of curves illustrating the dependence of photogenerated holes on layer thickness.

By varying $\Delta p(\rho,0)$ for different values of $L_p$ for a 2μm thick n-GaAs slab for $\rho_0=2$ μm the family of curves shown in FIG. 3, which illustrate the dependence of the (normalized) surface distribution of photogenerated holes on the diffusion length, was obtained. The width of this distribution, and thus the trench width, spreads for larger values of $L_p$. The effect of varying the layer thickness d for $L_p=14$ μm and $\rho_0=2$ μm is shown in FIG. 4. These curves reveal that the width of the distribution increases as the layer thickness is decreased, thereby increasing the degree of carrier confinement, from the bulk $(d >> L_p)$ to the thin layer case $(d < L_p)$. Not only does this model predict the same trench width dependence on $L_p$, it also reveals that increased lateral etching occurs as the layer becomes thinner. The dependence of trench width on the diffusion length is easily seen in FIG. 10 (n/n+Si) and FIG. 11 (n/n+-GaAs), as well as in the n-GaAs/n-AlGaAs heterostructure shown in FIG. 2. As previously explained, the epilayers on the n/n+ samples have considerably longer diffusion lengths than the substrates. On the GaAs/AlGaAs heterostructure, the AlGaAs layer ($L_p$~-b 0.5 μm) has a much narrower trench width than the GaAs layers ($L_p$~15 μm). Moreover, the widening effect due to decreasing the layer thickness under the beam spot has been observed during etching of the top GaAs as the etched contour approached the GaAs/AlGaAs interface; this effect is seen by comparing FIGS. 1A, 1B and 1C.

By utilizing the carrier confining properties of GaAs/AlGaAs heterostructures it is possible to control the direction of etching within these multilayers, with the morphology of the laser-etched features depending on the diffusion length and bandgap of each layer within the body. Neglecting the deformation of the etched surface, lateral etching can be accounted for on the simple premise of the confinement of diffusing minority carriers. The herein disclosed method has been successfully used for the fabrication of optoelectronic components, such as rib waveguides, vertically stacked waveguides and directional couplers. Additionally, this technique has been utilized for the maskless fabrication of microcleaved semiconductor facets utilizing the structure shown in FIG. 2.

Figures 5A, 5B:
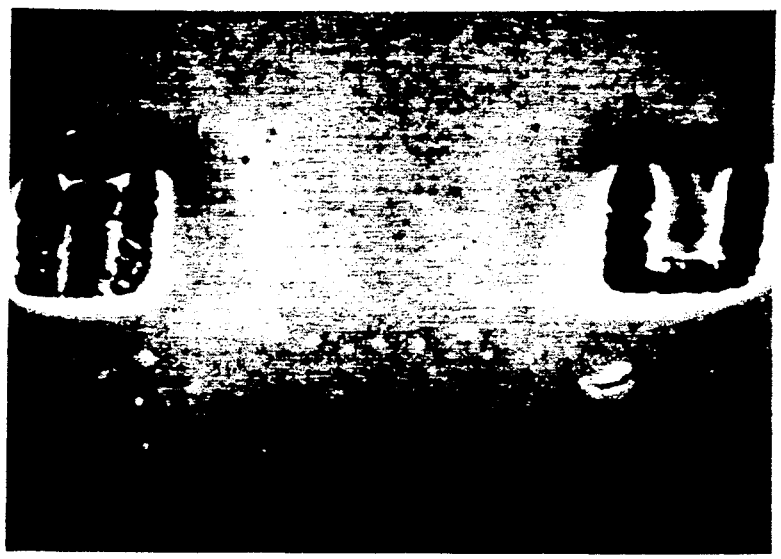
FIG. 5A is a photomicrograph of a laser-etched cantilever structure.
FIG. 5B is a photomicrograph which shows a smooth semiconductor facet wall left behind after microcleaving the cantilever of the FIG. 5A structure.
Figure 6:
FIG. 6 is a photomicrograph showing an enlargement of the cleaved facet wall shown in FIG. 5B.

Additionally, the microstructure shown in FIG. 2 has a number of immediate applications to integrated optics, namely, the cleaving of facets for mirrors in semiconductor diode lasers. In the monolithic integration of lasers with other optoelectronic components, a major drawback is the formation of laser mirrors by the cleavage method, which severely limits the size of the usable substrate area. To illustrate the potential use of this etching technique to the formation of laser facets in a two step process, a "U" shaped structure was direct-written such that the legs of the "U" are spaced no more than twice the width of the undercut shown in FIG. 2, i.e. 16 μm. This forms a cantilever structure since the sandwiched n-GaAs layer within the "U" is completely removed as shown in FIG. 5A. By applying mechanical pressure from a probe tip, or ultrasonic vibrations, for example, the cantilever was "microcleaved", leaving behind a smooth semiconductor facet perpendicular to the surface without fracturing the wafer, as shown in FIG. 5B. An enlargement of this cleaved structure is shown in FIG. 6.

This technique in addition to showing promise for the fabrication of electro-optical devices, may also find application in making micromechanical and microsensor devices on silicon. The current trend being to vertically stack electronic devices vertically for achieving high packing densities, etching techniques will be needed to access buried layers. This localized photochemical etching process may prove to be useful for such a task, especially if used in conjunction with gas or vapor phase deposition techniques to metallize buried layers, for example.

Although the invention has been described and illustrated in detail, it is to be understood that the same is by way of illustration and example only and is not to be taken by way of limitation, since it will now occur to one skilled in the art that the described parameters of the etching process may be amenable to modification without departing from the true spirit of the invention. For example, instead of illuminating the semiconductor body at a wavelength of 514 nm, a laser having a wavelength whose energy is above the bandgap energy, creating carriers which access the electrochemical redox levels, and operating at substantially the indicated intensity levels may be used; it has been observed, however, that at an intensity level of approximately 50 watts/cm$^2$, the width of the undercut is shorter at the 257 nm wavelength than at 514 nm due to a larger S at this UV wavelength (see Equation (2)).

Figure 12:
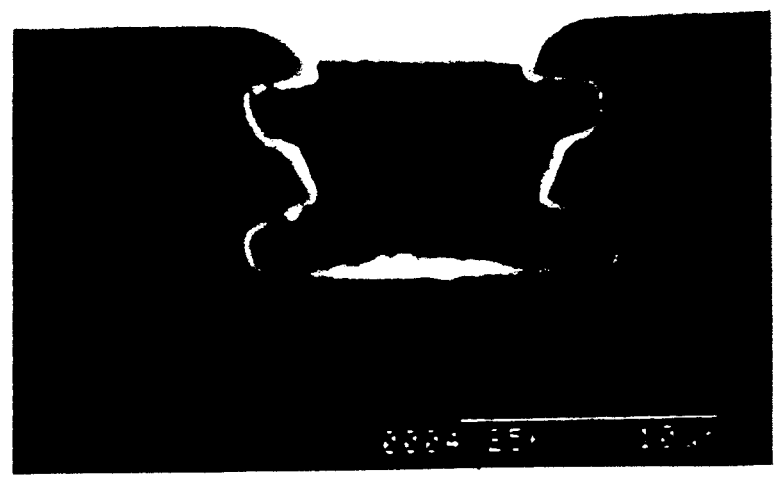
FIG. 12 is a photomicrograph of the cross-section of a line etched through a GaAs/AlGaAs heterostructure and illustrating the selective etching of the AlGaAs layer.
Figure 13:
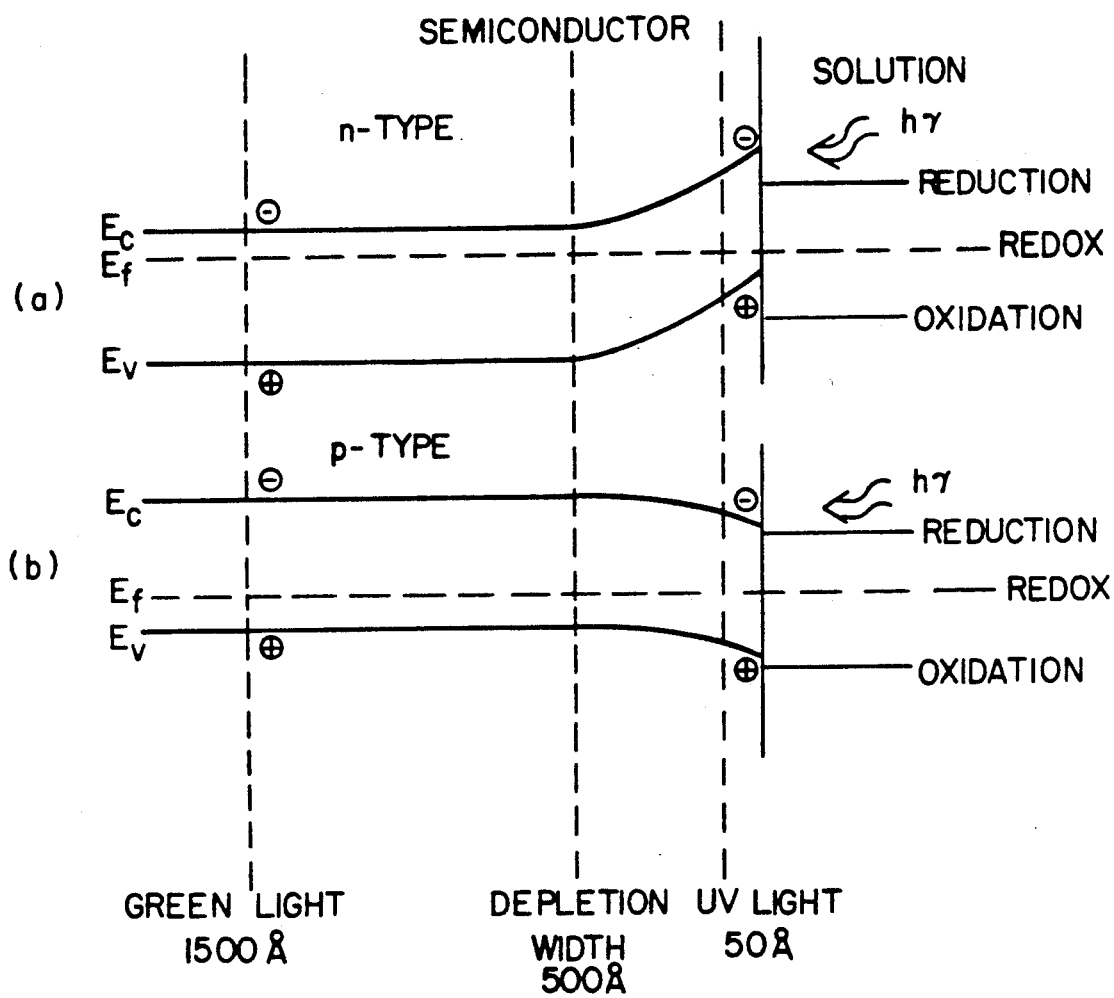
FIG. 13 is a diagram showing general surface band bending characteristics at the semiconductor/solution interface for n-type (curve (a)) and p-type (curve (b)) semiconductors.
Figure 14A:
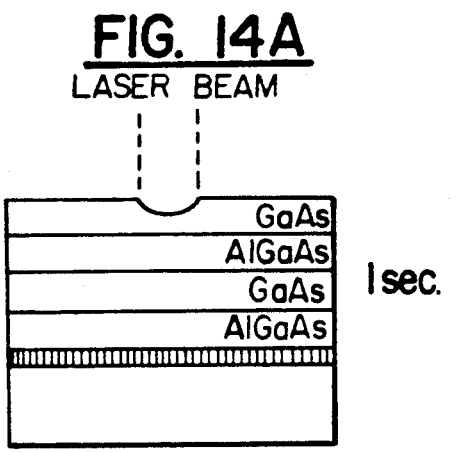
FIGS. 14A to 14H are schematic cross-sectional views illustrating the temporal evaluation of the structure shown in FIG. 12.
Figure 14B:
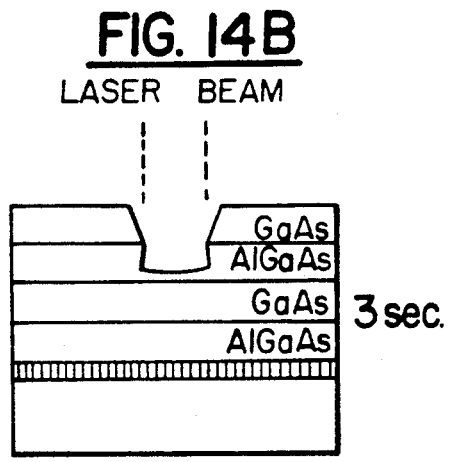
Figure 14C:
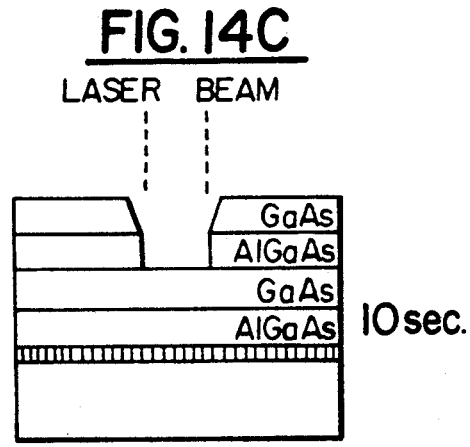
Figure 14D:
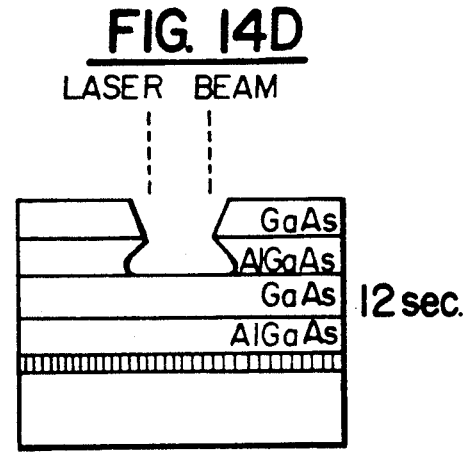
Figure 14E:
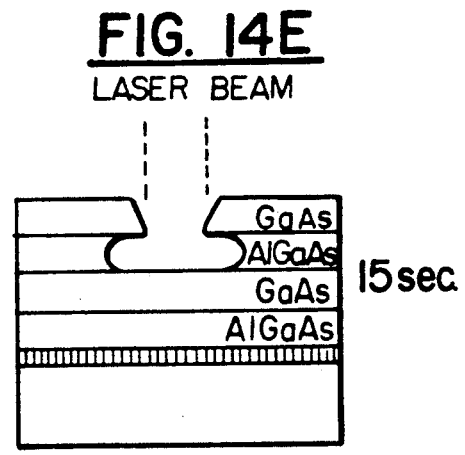
Figure 14F:
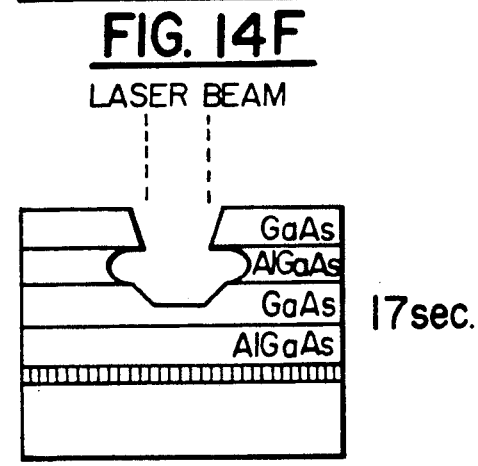
Figure 14G:
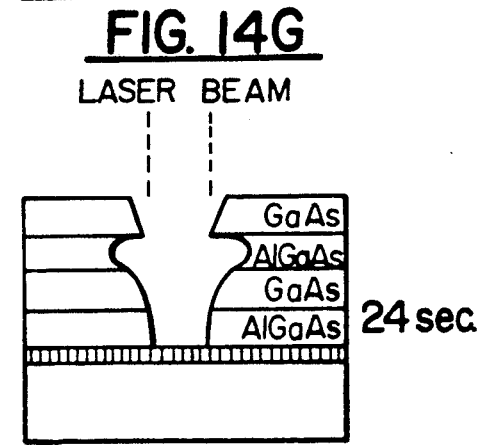
Figure 14H:
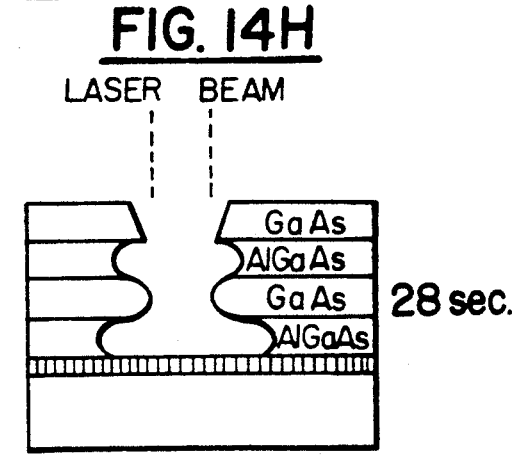

Within a range of illumination intensity from 0 to 500 watts/cm$^2$ for the GaAs/AlGaAs : 5% HNO$_3$ system, the etching mechanism is substantially linear with the illumination intensity and thus proportional to the hole concentration at the semiconductor/solution interface. The upper limit of this range will depend on the particular semiconductor/etchant system. However, at even higher intensities the laser light can significantly change the surface potential difference between the GaAs and AlGaAs layers in contact with the solution; this, in turn, can modify the etching chemistry and quench the carrier confinement mechanism. As shown in FIG. 12, at an intensity of 5 KW/cm$^2$ the etching material selectivity is reversed to cause underetching of the AlGaAs layers. FIGS. 14A and 14H, which illustrate the temporal evolution of the etched structure shown in FIG. 12 at various times following the start of etching, provide some insight into the etching mechanism. In contrast with the low intensity mechanism where the undercut is formed as soon as the beam etches the buried n-GaAs layer (FIGS. 1E and 1F), the AlGaAs undercut occurs after the beam has already etched this layer and begins to etch the GaAs layer below it (FIG. 14C). Here the vertical etch rate drops to nearly zero and the trench is etched laterally (FIGS. 14D and 14E). However, when the light begins to etch into the next GaAs layer (FIGS. 14F) the lateral etching in the AlGaAs layer stops. Following etching through the second GaAs layer and second AlGaAs layer (FIG. 14G), the latter layer is etched laterally to a greater extent than occurs in the first AlGaAs layer. This effect is important because it allows the selective underetching of either the GaAs layer or the AlGaAs layer by setting the light intensity at about 50 W/cm$^2$ for the first case and at about 5 KW/cm² for the second case. However, if the described carrier confinement mechanism is to be utilized to generate layer undercuts, light intensities in the lower range must be used, and in no case should the light intensity be high enough to heat the semiconductor body.

Also, although the method has been described in connection with the etching of n-GaAs/n-AlGaAs multilayers, it is also useful for the controlled etching of the InGaAsP material system using a sample of multilayers of n-InP/n-In n-InP/n-In$_{0.53}$Ga$_{0.47}$As, for example, with InGaAs being the buried layer that is etched due to the confinement of carriers in the smaller band gap material.

Also, although the solution/etchant interface is preferably illuminated by light from a laser because of its single frequency and the fact that it can be focused to a small spot-size to perform maskless etching, it will be understood that the described carrier confinement also occurs if instead light from a lamp, is projected through a mask, formed by conventional lithography techniques, onto the multilayer semiconductor body; the mask may be separate or formed on the semiconductor body.

We claim:

1. A method for etching a multilayer semiconductor body having first and second layers and an intermediate layer disposed therebetween which has a carrier diffusion length longer than that of said first and second layers and said first and second layers confine photogenerated carriers to said intermediate layer to form a laterally extending undercut in said intermediate layer, said method comprising the following uninterrupted sequence of steps:
   immersing said semiconductor body in an etching solution that etches the layered semiconductor material at a relatively slower rate in the absence of light than in the presence of light,
   exposing a selected area of the immersed major surface of said first layer to light having intensity and wavelength selected to cause carriers photogenerated at the interface between said etching solution and the semiconductor material exposed to said etching solution to readily access the redox levels of all layers of the body to be etched until a vertical opening is etched through said first layer,
   following etching of said vertical opening through said first layer continuing to expose to said light the area of said intermediate layer disposed beneath said vertical opening until a vertical opening with lateral undercut is etched in said intermediate layer which undercut has an area greater than the area of said vertical opening in said first layer, and
   following etching through said intermediate layer, continuing to direct said light through the vertical openings in said first and intermediate layers onto said second layer until a vertical opening is etched through said second layer.

2. A method as defined by claim 1, wherein said light has an intensity selected from intensity levels in a range within which the etching mechanism for said etching solution/semiconductor system is substantially linearly proportional with illumination intensity.

3. A method as defined by claim 1, wherein said light is a beam of light produced by a laser.

4. A method as defined by claim 1, wherein said step of exposing a selected area of said major surface of said first layer includes projecting light from a lamp through a mask onto said major surface.

5. A method as defined by claim 1, wherein said semiconductor body is a multilayer heterostructure having alternating layers of GaAs and AlGaAs, wherein said intermediate layer is GaAs,
   wherein said etching solution is nitric acid, and
   wherein said step of exposing a selected area of said major surface of said first layer includes exposing said selected area to a laser beam having an illumination intensity selected from a range of intensities from about zero to about 500 watts/cm².

6. A method for etching a multilayer semiconductor body having first and second layers and an intermediate layer disposed therebetween to form a laterally extending undercut in said intermediate layer, said method comprising the steps of:
   immersing said semiconductor body in an etching solution that etches the materials of said body at a relatively higher rate in the presence of light than in the absence of light,
   exposing a selected area of the major surface of the first layer of said immersed semiconductor body to light having a predetermined wavelength and a first or a second illumination intensity selected from a first intensity which for said etching solution/semiconductor system promotes lateral etching of an intermediate layer formed of a material having a diffusion length longer than the diffusion lengths of the materials of which said first and second layers are formed, and a second intensity higher than said first intensity which for said etching solution/semiconductor system promotes lateral etching of an intermeidate layer formed of a material having a diffusion length shorter than the diffusion lengths of the materials of which said first and second layers are formed until a vertical opening is etched through said first layer and a vertical opening with lateral undercut is etched in said intermediate layer.

7. A method as defined by claim 6, wherein said step of exposing includes exposing said body to light having said first illumination intensity and a wavelength at which carriers photogenerated at the interface between the etching solution and the semiconductor material can readily access the redox levels of all layers of the body to be etched, and
   following etching through said intermediate layer continuing to direct light through the vertical opening in said first and intermediate layers until a vertical opening having an area smaller than the area of said lateral undercut is etched through said second layer.

8. A method as defined by claim 7, wherein said semiconductor body is a GaAs/AlGaAs heterostructure having alternating layers of GaAs and AlGaAs and a GaAs intermediate layer,
   wherein said etching solution is nitric acid, and,
   wherein said light has said first illumination intensity and is selected from a range of intensities from about zero to about 500 watts/cm².

9. A method as defined by claim 6, wherein said semiconductor body is a GaAs/AlGaAs heterostructure having alternating layers of GaAs and AlGaAs and an AlGaAs intermediate layer,
   wherein said etching solution is nitric acid, and wherein said step of exposing includes exposing said major surface to light having said second illumination intensity.

10. A method as defined by claim 9, wherein said second illumination intensity has a value of about 5 KW/cm$^2$.

11. A method for etching a multilayer semiconductor heterostructure having first and second layers of one conductivity type and an intermediate layer of a second conductivity type disposed therebetween to form a laterally extending undercut in said intermediate layer, the method comprising the following uninterrupted sequence of steps:

immersing the heterostructure in an etchant that etches the materials of which said layers are formed at a relatively higher rate in the presence of light than in the absence of light, directing a laser beam onto a selected area of the immersed first layer of the heterostructure until a vertical opening is etched therethrough, exposing the area of the intermediate layer underlying the vertical opening in the first layer to said laser beam until a vertical opening is etched through said intermediate layer and an undercut extending laterally therefrom is etched between the first and second layers which has an area greater than the area of the vertical opening through said first and intermediate layers, and exposing the area of the second layer underlying the vertical opening through said first and intermediate layers to said laser beam until a vertical opening is etched through said second layer.

12. A method as defined in claim 11, wherein said first and second layers are formed of AlGaAs and said intermediate layer is formed of GaAs, wherein said etchant is nitric acid, and wherein said beam of light has an illumination intensity selected from a range of intensities from about zero to about 500 watts/cm$^2$.

* * * * *

UNITED STATES PATENT AND TRADEMARK OFFICE
CERTIFICATE OF CORRECTION

PATENT NO. : 5,081,002

DATED : January 14, 1992

INVENTOR(S) : Mark N. Ruberto et al.

It is certified that error appears in the above-identified patent and that said Letters Patent is hereby corrected as shown below:

On the title page, 10th line of ABSTRACT, "casuing" should read -- causing --. Col. 1, line 7, "C00067" should read -- C-0067 --. Col. 3, line 19, "LiNbO3" should read -- $LiNbO_3$ --. Col. 4, line 53, "FIG. 9" should start a new line. Col. 5, line 29, "514 $\mu$m" should read -- 514 nm --. Col. 6, line 22, "(n=$10^{19}$/$cm^3$" should read -- (n=$10^{19}$/$cm^3$) --; line 61, "$\rho$" should read -- $\rho_o$ --. Col. 7, line 31, "b 0.5" should read -- 0.5 --. Col. 10, line 35, "intermeidate" should read -- intermediate --.

Signed and Sealed this

Fourth Day of May, 1993

Attest:

MICHAEL K. KIRK

*Attesting Officer*   *Acting Commissioner of Patents and Trademarks*